United States Patent [19]

Bowman

[11] 4,006,467
[45] Feb. 1, 1977

[54] ERROR-CORRECTIBLE BIT-ORGANIZED RAM SYSTEM

[75] Inventor: David A. Bowman, Glendale, Ariz.

[73] Assignee: Honeywell Information Systems, Inc., Phoenix, Ariz.

[22] Filed: Nov. 14, 1975

[21] Appl. No.: 632,127

[52] U.S. Cl. .......................... 340/173 R; 340/173; 340/66; 340/173 AM

[51] Int. Cl.² ...................................... G11C 11/40

[58] Field of Search ....... 340/173 R, 173, 173 AM; 307/238

[56] References Cited

UNITED STATES PATENTS

| | | | |
|---|---|---|---|
| 3,365,707 | 1/1968 | Mayhew | 340/173 R |
| 3,893,088 | 7/1975 | Bell | 340/173 R |

Primary Examiner—Terrell W. Fears
Attorney, Agent, or Firm—J. Stanley Edwards; William W. Holloway, Jr.; Nicholas Prasinos

[57] ABSTRACT

A memory organization system is disclosed which comprises an improved, bit-organized RAM system. The invention substantially limits errors within the RAM system such that they are error-correctible by existing error detection and correction means. Commonly available RAMs are organized on a logic board such that each bit of a word being addressed is provided by a different RAM chip and is driven by a distinct driver. In this manner a malfunction in either a chip or a driver circuit results in only a one-bit error per word and overall system performance is also improved.

9 Claims, 5 Drawing Figures

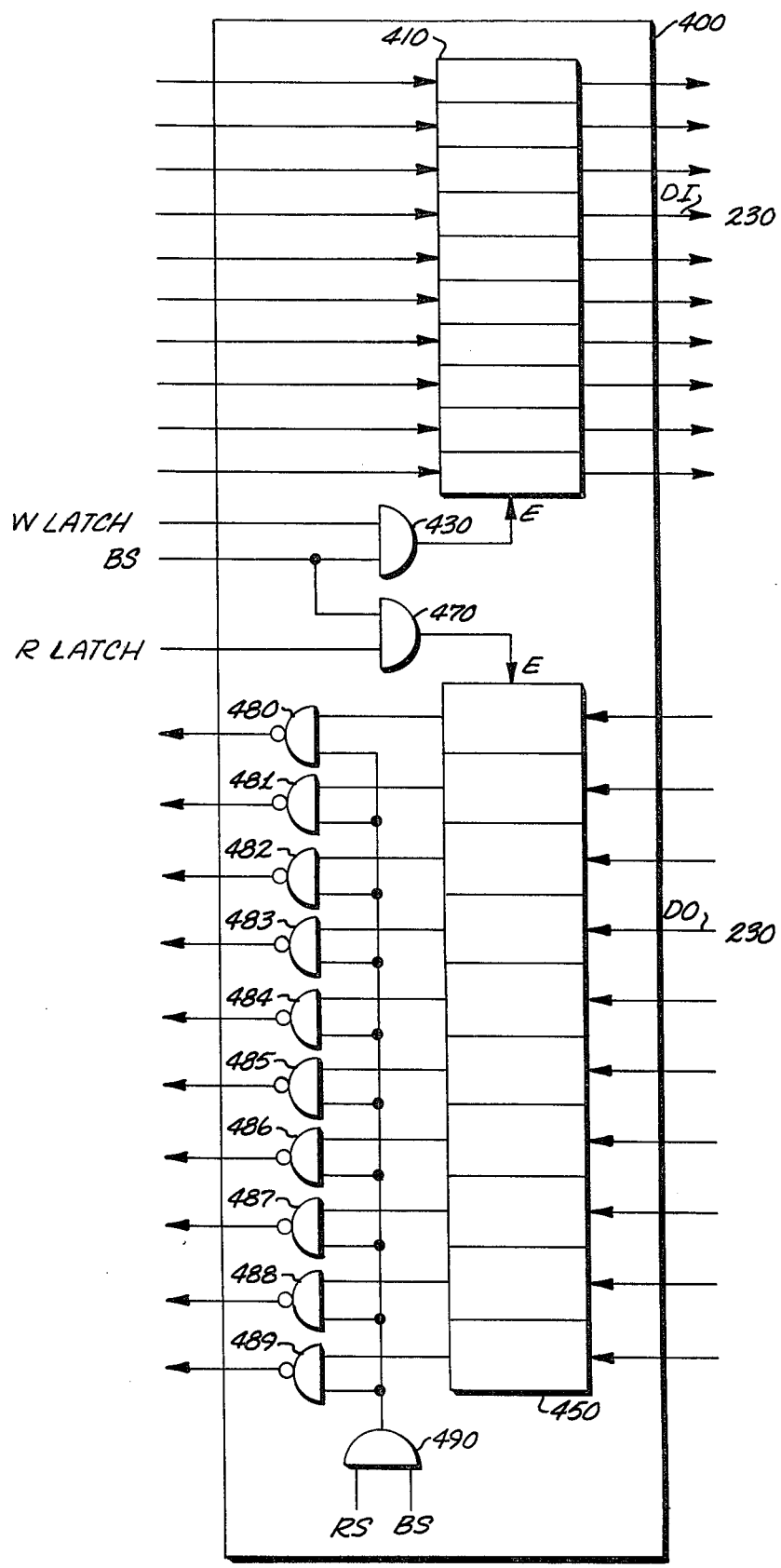

ERROR-CORRECTIBLE BIT-ORGANIZED RAM SYSTEM

BACKGROUND OF THE INVENTION

1. Field of the Invention

This invention relates generally to memory systems for electronic data processing systems and, in particular, to an improved bit-organized memory organization which provides an error-correctible RAM system.

2. Description of the Prior Art

In recent years data processing systems have been evolving towards more efficient and larger systems. Of critical importance to these data processing systems are their memory systems. Trends in the development of data processing systems have been paralleled, and significantly aided, by the development of vary large memory systems.

Among the requirements for memory systems in need for extremely high accuracy. Since this requirement generally exceeds cost-effective solutions for providing error-free components and organizations, memory systems are generally provided with error-detection and correction (EDAC) subsystems. The detection part of an EDAC subsystem will detect the presence of errors within its associated memory system. However, the correction portion of the EDAC system is generally limited to correcting only those errors are one-bit per word. This means that multi-bit errors (an error occurring in more than one bit per word) can be detected but not corrected, and will result in the requirement for system overhead. System overhead may be in the form of other means to correct these errors (such as softwear or possibly result in shutting down the system until the errors can be isolated and corrected. Overhead is extremely costly and therefore it is highly desirable to minimize the cause of such an occurrence, namely, multi-bit errors.

Memory systems are typically comprised of semiconductor chips such as random access memories (RAMs). In general, there are three different causes of errors in a memory system:

1 faulty semiconductor memory chips,
2 faults within associated memory hardware, and
3 error causing factors within the memory environment.

The first gategory is self-explanatory. The second category includes faults within such associated circuitry as logic, drivers, receivers, etc. or various types of shorts (for example, those caused by loose solder or system vibration). The third category includes such factors as heat, atmospheric pressure, humidity or exposure to light. The present invention is directed to errors resulting from the first or second categories. Its affect is to limit errors caused by these factors to only one-bit per word and hence be error-correctible. In an appropriately designed system, such as that disclosed herein, this can have the overall effect of limiting approximately ninety percent of all memory errors to one-bit per word errors.

OBJECTS OF THE INVENTION

It is an object of the present invention, therefore, to provide an improved memory system.

It is another object of the present invention to provide a memory system with a relatively long mean-time between failures (MTBF).

It is another object of the present invention to provide an organization for a memory system which minimizes errors within said memory system such that they are predominantly error-correctible.

It is still another object of the present invention to provide an organization for a memory system which minimizes the occurrence of multi-bit errors within said memory system.

It is yet another object of the present invention to provide a system which isolates an error in one component of the memory system from other components of the system such that only one-but errors per word occur.

Other objects and benefits will become apparent from the following description of the preferred embodiment of the invention when read in conjunction with the drawings contained herewith.

SUMMARY OF THE INVENTION

A memory organization is disclosed which comprises an improved, bit-organized RAM system. The organization focuses on the bit level and substantially limits errors within said memory system such that they are only one-bit per word and hence error-correctible by existing error detection and correction means.

Commonly available RAMs are organized (e.g. on a logic board) such that each bit of a word is found on a different RAM chip and driven by a distinct driver. More specifically, the RAM chips are oganized into blocks. Each of the blocks contains a plurality of chips and has a unique driver associated with it. There are $n$ blocks for $n$-bit words in the memory system. Each block contains one bit of each word. In this manner a malfunction in a driver circuit or in a chip results in only a one-bit error per word.

Associated circuitry is disclosed for addressing multiplexing, and buffering such a memory system. Errors in this type of related circuitry as well as errors within the memory system environment may result in multi-bit errors per word, but the invention nonetheless provides an improved system with approximately 90% of all errors being error-correctible.

BRIEF DESCRIPTION OF THE DRAWINGS

FIG. 5 is a diagram showing the data buffer circuits of FIGS. 1 and 2 in greater detail.

DESCRIPTION OF THE PREFERRED EMBODIMENT

Figure 1:
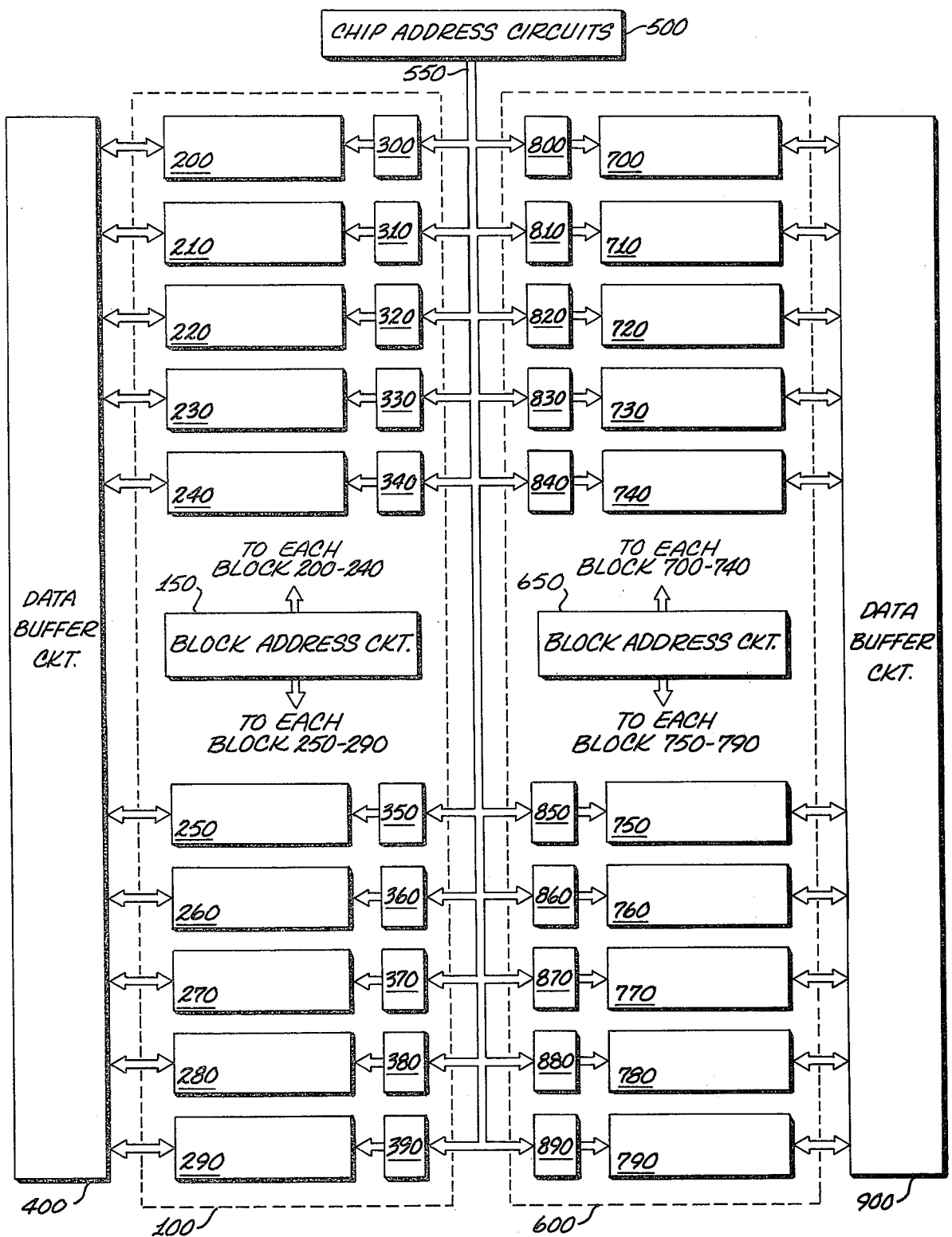
FIG. 1 is a schematic diagram showing an organization of RAM chips for 20-bit words and associated circuitry within a memory system according to the present invention.

Referring now to FIG. 1, a block diagram of the memory organization of the present invention is shown. The main components of FIG. 1 are memory subsections 100 and 600. Memory subsection 100 is made up of 10 memory blocks 200 to 290, each with an associated driver circuit 300 to 390, respectively. Each block 200 to 290 is comprised of a plurality of RAM chips. In the preferred embodiment, eight 4K RAMs are used in each block, resulting in storage capability for 32K bits in each block and 32K words within the memory system. Driver circuits 300 to 390 provide signals for addressing a location within the RAM chips comprising blocks 200 to 290 respectively. These signals are provided in parallel to all of the chips on all of the blocks in the memory system. Accordingly, to determine which of the RAM chips in each block is to be accessed, block address circuit 150 provides signals in parallel to blocks 200 to 290 (although only the connections to blocks 240 and 250 are shown in FIG. 1). In this manner only one chip in each of the blocks is selected at a time, although all of the blocks are simultaneously addressed. Data buffer circuit 400 acts as an input and output buffer for the memory system and is connected to blocks 200 to 290 by data buses connected to each block. Each of the data buses carries the signals to and from each of the chips in the associated block in parallel.

Memory subsection 600 is symmetric to subsection 100 described supra. It is comprised of 10 memory blocks 700 to 790, each with an associated driver circuit 800 to 890 respectively. Each block 700 to 790 is comprised of a plurality of RAM chips. Driver circuits 800 to 890 provide signals in parallel for addressing a location within the RAM chips comprising blocks 700 to 790 respectively. Block address circuit 650 provides signals in parallel to blocks 700 to 790 (although only the connection to blocks 740 and 750 are shown in FIG. 1) which determine which one of the RAM chips comprising each of the blocks 700 to 790 is to be accessed. Data buffer circuit 900 acts as an input and output buffer for signals transmitted to and received from subsection 600 via data buses corresponding to each of the blocks 700 to 790.

It will be apparent to one of ordinary skill in the art that data buffer circuits 400 and 900 can be combined into a single data buffer circuit. Bidirectional or pairs of unidirectional data buses may be used in conjunction with these data buffer circuits without departing from the spirit and scope of the present invention. Similarly, block address circuits 150 and 650 may be combined in certain implementations.

Chip address circuit 500 is responsive to external control and address signals. It sends signals over control bus 550 to driver circuits 300 to 390 and 800 to 890. As will be evident from the description below, all of the driver circuits receive signals from control bus 550 in parallel.

Figure 2:
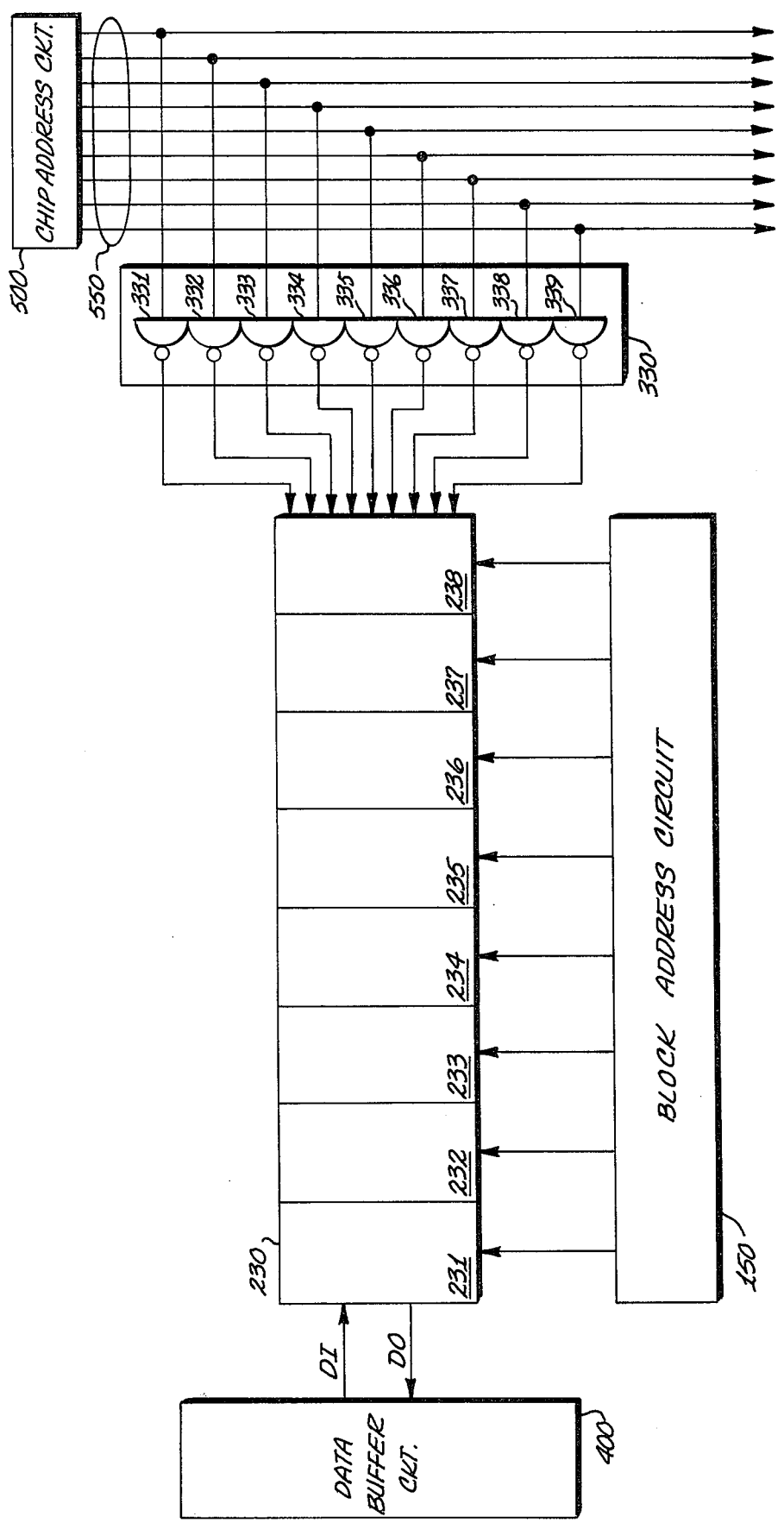
FIG. 2 is a diagram showing a 32K × 1 bit array with associated driver circuits and addressing means for the memory organization.

Referring now to FIG. 2 a more detailed diagram is given showing one of the blocks 200 to 290 and 700 to 790 of FIG. 1 and its associated driver circuit in greater detail. In FIG. 2, block 230 and associated driver circuit 330 is given, but it is obvious to one skilled in the art that each of blocks 200 to 290 and associated drivers 300 to 390 are identical. Similarly blocks 700 to 790 and drivers 800 to 890 are identical to block 230 and driver circuit 330 shown in FIG. 2, except for substitution of block address circuit 650 for block address circuit 150 and connection to data buffer circuit 900 instead of data buffer circuit 400. Chip address circuit 500 provides signals in parallel to all of the driver circuits 300 to 390 and 800 to 890 over control bus 550. In FIG. 2, control bus 550 is shown as being comprised of 9 wires or buses. Each of these lines is connected to a driver 331 to 339 within driver circuit 330. Three signals (gated W, gated CAS and CS) are control signals for the RAM chips. The remaining six signals are for addressing a location within a RAM chip. Two-level multiplexing is given (as described below) which provides the equivalent of 12 address signals to the chips. One of ordinary skill in the art will recognize that 12 binary signals are required for addressing a 4K system, as $2^{12} = 4096$. Signals from drivers 331 to 339 are sent in parallel to all the chips comprising block 230.

block 230 is shown as comprised of eight chips 231 to 238. In the preferred embodiment 4K MOS RAM chips are used (which are TTL compatible). Chips 231 to 238 are addressed in parallel by the signals from driver circuit 330. However, it is desired to access only one of these chips at any one time. Signals provided to the blocks 200 to 290 in parallel by block address circuit 150 perform this chip select function. Data is sent to block 230 over the data-in line DI from data buffer circuit 400 and from block 230 over the data-out line DO to data buffer circuit 400. A unique pair of data-in and data-out lines is provided for each block. In this manner, transmission of data to and from all of the blocks is performed in parallel, thereby providing access to all of the bits in a word in parallel.

With respect to the remaining figures, it is assumed that the memory organization disclosed is operational within a memory system environment which provides address and control signals. The functional aspects of these signals are described infra. Additionally the following table will provide a better understanding of the signals:

| | | |
|---|---|---|
| CS | — | Chip Select |
| CAS | — | Column Address Strobe |
| RAS | — | Row Address Strobe |
| BS1 to BS4 | — | Board Select Signals |
| W | — | Write |
| WLATCH | — | Write Latch |
| RLATCH | — | Read Latch |
| A0 to A14 | — | Address Signals |

Figure 3:
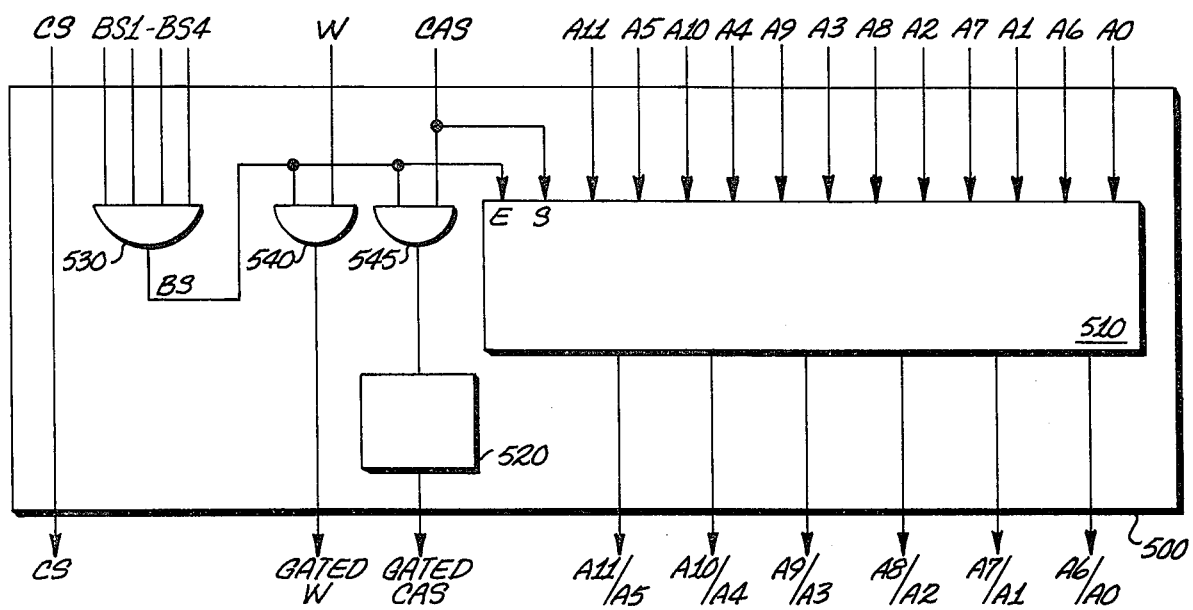
FIG. 3 is a diagram showing the chip addressing means of FIGS. 1 and 2 in greater detail.

Referring now to FIG. 3, chip address circuit 500 is shown in greater detail. Twelve address signals A0 to A11 are received by circuit 500. The signals A0 to A11 are received by component 510 which is a conventional multiplexer. Multiplexer 510 is enabled by a signal BS and is also responsive to a control (multiplexing) signal CAS. Multiplexer 510 generates two sets of six address signals, dependent upon the state of the CAS signal, for transmission to the driver circuits 300 to 390 and 800 to 890 as discussed above. The first set of 6 signals corresponds to six row inputs; the second set of 6 signals corresponds to six column inputs. Chip address circuit 500 also provides 3 control signals to the chips via the driver circuits. The CAS signal is delayed by delay 520 and used for strobing in the column address signals. The delay of the delay circuit 520 corresponds to the delay inherent in the operation of multiplexer 510. The presence of a write signal W will cause the accessed chips to operate in a write mode; its absence will cause operation in a read mode. The CS signal is used during a refresh mode of operation. It disables half (the column) of each chip and thereby reduces power requirements during a refresh.

It is noted that the W and CAS signals are gated by the BS signal by gates 540 and 545 respectively. The BS signal corresponds to the selection of one board of a memory system. FIG. 1 shows a 32K × 20 bit word memory system or memory board. Such boards may be combined to form larger memory systems. For example, if 16 boards, each identical to FIG. 1 are combined, a 516K × 20 bit word memory results. However, in addition to addressing within each board, a board addressing function is required. A 1-of-16 decoder may perform this function. Gate 530 shows one part of such a 1-of-16 decoder, which may be found on one of the boards, and used to generate the board select BS signal for that board. Although decoding gate 530 is shown as part of chip address circuit 500, it will be obvious to one of ordinary skill in the art that it may be placed in any convenient location on a memory board.

Figure 4:
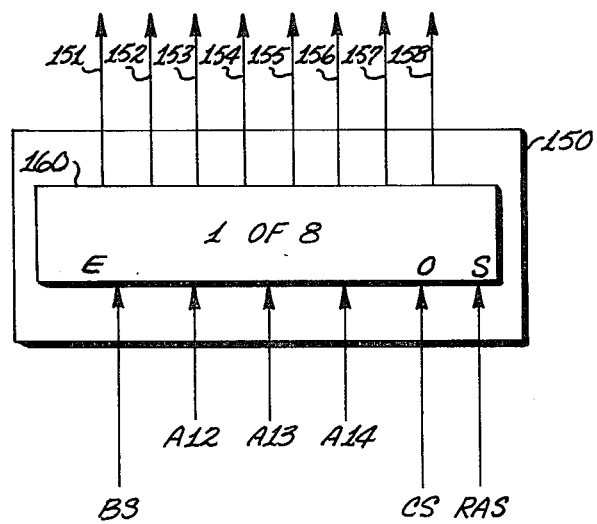
FIG. 4 is a diagram showing the block addressing means of FIGS. 1 and 2 in greater detail.

Referring now to FIG. 4, block address circuit 150 is shown in greater detail. In the preferred embodiment circuits 150 and 650 are identical. Accordingly, a single unit may be used instead of two. However, this will double the impact of any error due to a malfunction in the unit, which will become more probably due to the increased load and stress on the circuit. The basic component of circuit 150 (or circuit 650) is a 1-of-8 decoder 160. Decoder 160 receives input signals A12 to A14 and generates a signal over one of its input lines 151 to 158. In this manner, only one of the eight RAMs comprising each block is selected at any one time. Decoder 160 is enabled by signal BS. Additionally, decoder 160 is responsive to refresh signal CS via an override terminal, such that during a refresh mode of operation lines 151 to 158 all carry high signals so that the entire memory system (i.e. all of the chips) will be refreshed. Signal CS may be coupled to line 151 to 158 via amplifiers or via logic internal to decoder 160 to achieve this functionality. Similarly a RAS signal may be gated with each of the 1-of-8 decoder lines 151 to 158. The RAS signal is used to time or strobe into the RAMs address signals A0–A5.

Referring now to FIG. 5, data buffer circuit 400 is shown in greater detail. (Data buffer circuit 900 is identical except for its connection to blocks 700 to 790). Buffer 400 is comprised of 10-bit storage register 410. Register 410 receives 10 signals in parallel over data input lines from other parts of the data processing system, and when enabled by a latching signal WLATCH (which is gated by the signal BS by gate 430), stores the data represented by its input signals. This data is then available for transmission to corresponding blocks 200 to 290 via the 10 data-in lines, such as line DI to block 230.

Buffer 400 is also comprised of 10-bit storage register 450. Register 450 receives signals in parallel via the 10 data-out lines from blocks 200 to 290, such as line DO from block 230. Register 450, when enabled by a latching signal RLATCH (which is gated by the signal BS by gate 470), stores the data represented by its input signals. This data is then available for transmission to other parts of the data processing system. Output signals from register 450 are gated by inverter gates 480 to 489, which are enabled by a read strobe signal RS (which is gated by the signal BS by gate 490). It is noted, therefore, that this memory system inverts from its input to its output.

The memory organization described in detail above is comprised of a plurality of RAM chips. The preferred embodiment has been described for usage with 4K MOS RAM chips which are TTL compatible. Since each block is comprised of 8 chips, a 32K memory system is provided. Each section is comprised of 10 blocks and there are 2 parallel sections. This provides for 20-bit words, each bit of each word found in a different block. Overall the memory organization provides a 32K by 20 bit memory system. Modification of this organization is clearly possible. For instance, a 64K × 10 bit word system can readily be provided by logical gating of input and output signals.

It is emphasized that each bit of each word is driven by a distinct driver circuit and each bit is also found on a distinct chip. Errors in either a driver circuit or a chip are therefore isolated to one-bit errors per word which is error correctible by conventional error detection and correction (EDAC) means. This reduction of errors to one-bit per word is imperfect. For example, errors in address circuits 500, 150 and 650 or in buffer circuits 400 and 900 can result in multiple bit errors per word, errors which are not error correctible. Nonetheless, a greater percentage of the system minimizes multi-bit errors, with the result that mean-time between failure (MTBF) for the system is greatly improved.

The provision of individual driver circuits for each bit of a word (i.e. for each block) has other advantages in the context of the present system. The chips are driven in parallel and have an effective impedance related to the number of chips which are operational. A defective chip will change the impedance seen by a driver and may therefore affect its performance. In prior art systems each driver typically has a load of up to 80 RAMS. Since the present invention has only 8 chips being driven by a driver at a time, this problem is obviated. Furthermore, since each driver drives only eight chips at a time, the stress on the drivers is reduced. Stress has been found to be a major cause of driver malfunction. Accordingly, MTBF for the drivers, and hence the system is improved. Finally, the use of TTL driver chips allows for lower power requirements for each driver. Since the present invention requires increased usage of drivers over the prior art, a trade-off is presented in which the advantages of the present invention may be offset by the higher cost of more drivers. However, the low power and cost of TTL drivers effectively obviates this problem.

This invention offers consistent advantages if compared to previous memory organization systems. While an embodiment of the invention has been described in detail, it will be obvious to those skilled in the art that the invention may be otherwise embodied without departing from the spirit and scope of the present invention.

What is claimed is:

1. A memory organization for random access memory (RAM) chips comprising:
  chip address means for providing first signals;
  block address means for providing second signals; and
  memory means, connected to said chip address means and said block address means, said memory means including:
    a plurality of blocks of said RAM chips, each of said blocks responsive to said second signals for selecting one of said RAM chips; and
    a plurality of driver circuits corresponding to said plurality of RAM chip blocks each of said driver circuits responsive to said first signals for providing a set of third signals to the chips within said corresponding block, said third signal selecting a location within said RAM chips for accessing;
  data bussing means;
  data buffer means coupled by said data bussing means to said blocks for transmitting data to and from said blocks; and enabling means coupled to said chip addressing means to said block addressing means, and to said buffering means for enabling their operation.

2. The memory organization of claim 1 wherein said plurality of driver circuits includes means for driving eight of said RAM chips whenever the block containing said chips is accessed for a read or write operation.

3. The memory organization of claim 1 wherein said chip addressing means includes:
multiplexing means for providing said first signals to said driver circuits in two phases; and
demultiplexing means for providing a demultiplexing signal to said driver circuit, said demultiplexing signal being one of said first signals.

4. The memory organization of claim 1 wherein said block addressing means includes:
decoding means and a plurality of output lines coupled in parallel to said blocks for carrying said second signals, said decoding means providing an enabling signal over one of said output lines at any one time.

5. An organization system for a memory subsystem for n-bit words within an electronic data processing system, said memory subsystem including nxm random access memory (RAM) chips, said organization system comprising:
addressing means for providing address signals for selecting a cell site within said RAM chips;
selection means for providing select signals;
n driver means coupled in parallel to said addressing means and responsive to said address signals, each of said driver means providing a set of chip address signals; and
memory means including:
n memory submeans each comprised of m RAM chips, each of said n submeans responsive to said selection signals for enabling one of said n RAM chips, all of said n RAM chips in each of said submeans coupled to only one of said n driver means and responsive to said chip address signals.

6. The organization system of claim 5 further comprising:
n data bussing means; and
data buffer means coupled by each of said n data bussing means to a corresponding one of said n submeans for transmitting data to and from said submeans in parallel.

7. The organization system of claim 6 further comprising enabling means coupled to said chip addressing means, to said selection means, and to said data buffer means for enabling their operation.

8. The organization system of claim 5 wherein said chip addressing means includes:
multiplexing means for providing said address signals to said driver circuits in two phases; and
demultiplexing means for providing a demultiplexing signal to said driver circuit, said demultiplexing signal being one of said address signals.

9. The organization system of claim 5 wherein said selection means includes:
decoding means; and
a plurality of output lines coupled in parallel to said n submeans for carrying said selection signals to said n submeans, said decoding means providing an enabling signal over one of said output lines at any one time.

* * * * *